(12) United States Patent
Cao et al.

(10) Patent No.: US 12,431,849 B2
(45) Date of Patent: Sep. 30, 2025

(54) RADIO-FREQUENCY DIFFERENTIAL AMPLIFYING CIRCUIT AND RADIO-FREQUENCY MODULE

(71) Applicant: RadRock (Chongqing) Tech Co., Ltd., Chongqing (CN)

(72) Inventors: Yuan Cao, Guangdong (CN); Zijie Hu, Guangdong (CN); Xiaolei Lai, Guangdong (CN); Jianxing Ni, Guangdong (CN)

(73) Assignee: RadRock (Chongqing) Tech Co., Ltd., Chongqing (CN)

( * ) Notice: Subject to any disclaimer, the term of this patent is extended or adjusted under 35 U.S.C. 154(b) by 568 days.

(21) Appl. No.: 17/789,514

(22) PCT Filed: Oct. 26, 2021

(86) PCT No.: PCT/CN2021/126285
§ 371 (c)(1),
(2) Date: Jun. 27, 2022

(87) PCT Pub. No.: WO2022/089393
PCT Pub. Date: May 5, 2022

(65) Prior Publication Data
US 2023/0033265 A1 Feb. 2, 2023

(30) Foreign Application Priority Data
Oct. 30, 2020 (CN) .......................... 202011193334.7

(51) Int. Cl.
H03F 3/45 (2006.01)
(52) U.S. Cl.
CPC ....... *H03F 3/4508* (2013.01); *H03F 2200/06* (2013.01); *H03F 2200/09* (2013.01);
(Continued)

(58) Field of Classification Search
CPC ..................................... H03F 3/45; H03F 9/00
(Continued)

(56) References Cited

U.S. PATENT DOCUMENTS

| 3,855,431 | A | * | 12/1974 | Stewart | ..................... | H04B 3/36 |
| | | | | | | 379/344 |
| 5,477,188 | A | * | 12/1995 | Chawla | ................... | H03F 3/604 |
| | | | | | | 330/269 |

(Continued)

FOREIGN PATENT DOCUMENTS

| CN | 104953961 A | 9/2015 |
| CN | 106603022 A | 4/2017 |

(Continued)

OTHER PUBLICATIONS

International Search Report of PCT Patent Application No. PCT/CN2021/126285 issued on Jan. 27, 2022.

*Primary Examiner* — Henry Choe

(57) ABSTRACT

The radio-frequency differential circuit includes an input balun, an output balun, a first differential amplifying circuit, a second differential amplifying circuit, a first linear feedback circuit and a second linear feedback circuit; the first differential amplifying circuit is arranged between a first output end of the input balun and a first input end of the output balun; the second differential amplifying circuit is arranged between a second output end of the input balun and a second input end of the output balun; a first end of the first linear feedback circuit is connected with the input balun, a second end of the first linear feedback circuit is connected with the first differential amplifying circuit; a first end of the second linear feedback circuit is connected with the input balun, and a second end of the second linear feedback circuit is connected with the second differential amplifying circuit.

16 Claims, 5 Drawing Sheets

(52) U.S. Cl.
CPC .. *H03F 2200/144* (2013.01); *H03F 2200/451* (2013.01); *H03F 2203/45051* (2013.01); *H03F 2203/45116* (2013.01)

(58) Field of Classification Search
USPC .................................................. 330/260, 276
See application file for complete search history.

(56) References Cited

U.S. PATENT DOCUMENTS

| | | | |
|---|---|---|---|
| 6,081,159 | A | 6/2000 | Kim et al. |
| 8,965,322 | B2 * | 2/2015 | Mu ..................... H03F 1/347 |
| | | | 455/63.1 |
| 9,054,648 | B1 | 6/2015 | Xu |
| 10,447,209 | B2 * | 10/2019 | Wang ..................... H03F 3/211 |
| 2003/0114129 | A1 | 6/2003 | Jerng |
| 2008/0122538 | A1 | 5/2008 | Park et al. |
| 2013/0009704 | A1 | 1/2013 | Liao |
| 2015/0130539 | A1 | 5/2015 | Gorbachov |

FOREIGN PATENT DOCUMENTS

| | | |
|---|---|---|
| CN | 106712729 A | 5/2017 |
| CN | 107395130 A | 11/2017 |
| CN | 108206676 A | 6/2018 |
| CN | 108923756 A | 11/2018 |
| CN | 109462411 A | 3/2019 |
| CN | 110138351 A | 8/2019 |
| CN | 111082761 A | 4/2020 |
| CN | 211791447 U | 10/2020 |
| KR | 20080067904 A | 7/2008 |

* cited by examiner

RADIO-FREQUENCY DIFFERENTIAL AMPLIFYING CIRCUIT AND RADIO-FREQUENCY MODULE

CROSS-REFERENCE TO RELATED APPLICATION

The present application claims priority to Chinese Patent Application No. 202011193334.7 entitled "RADIO-FREQUENCY DIFFERENTIAL AMPLIFYING CIRCUIT AND RADIO-FREQUENCY MODULE" filed on Oct. 30, 2020, the contents of which is expressly incorporated by reference herein in its entirety.

TECHNICAL FIELD

The present disclosure relates to radio-frequency telecommunication technologies, and more particularly, to a radio-frequency differential amplifying circuit and a radio-frequency module.

BACKGROUND

With the development of wireless communication technology, various intelligent devices have been commonly used. The intelligence of intelligent devices cannot be achieved without various sensors with different functions. Electrical signals collected from these sensors are generally very weak, and theses weak electrical signals are often low-frequency signals, thus, these low-frequency signals need to be amplified. A differential amplifier is an electronic amplifier capable of amplifying the difference between two inputs with a fixed gain. Ideally, the differential amplifier only improves a power of an input signal without changing a content of the input signal, which requires that the differential amplifier keep the same gain over its operating frequency. However, gains of most of power amplifying elements used in the differential amplifier decrease as the frequency increases, so that the differential amplifier cannot achieve an ideal linearity; especially when the differential amplifier is used to amplify radio-frequency signals with complex modulation methods which have higher requirements on the linearity of the differential amplifier.

SUMMARY OF THE INVENTION

The present disclosure provides a radio-frequency differential amplifying circuit and a radio-frequency module, aiming to solve the problem that the conventional differential amplifying circuit cannot ensure a relatively-high linearity.

The present disclosure provides a radio-frequency differential amplifying circuit, wherein the radio-frequency differential circuit includes an input balun, an output balun, a first differential amplifying circuit, a second differential amplifying circuit, a first linear feedback circuit and a second linear feedback circuit; the first differential amplifying circuit is arranged between a first output end of the input balun and a first input end of the output balun; the second differential amplifying circuit is arranged between a second output end of the input balun and a second input end of the output balun; a first end of the first linear feedback circuit is connected with the input balun, a second end of the first linear feedback circuit is connected with the first differential amplifying circuit; a first end of the second linear feedback circuit is connected with the input balun, and a second end of the second linear feedback circuit is connected with the second differential amplifying circuit.

In an embodiment, when the input balun is a single-ended radio-frequency signal input balun, the first end of the first linear feedback circuit is configured to be connected with the first output end of the input balun, and the first end of the second linear feedback circuit is configured to be connected with the second output end of the input balun; or,
when the input balun is a single-ended radio-frequency signal input balun, the first end of the first linear feedback circuit is configured to be connected with the second output end of the input balun, and the first end of the second linear feedback circuit is configured to be connected with the first output end of the input balun.

In an embodiment, when the input balun is a double-ended radio-frequency signal input balun, the first end of the first linear feedback circuit is configured to be connected with the first output end of the input balun, and the first end of the second linear feedback circuit is configured to be connected with the second output end of the input balun; or,
when the input balun is a double-ended radio-frequency signal input balun, the first end of the first linear feedback circuit is configured to be connected with the second output end of the input balun, and the first end of the second linear feedback circuit is configured to be connected with the first output end of the input balun; or,
when the input balun is a double-ended radio-frequency signal input balun, the first end of the first linear feedback circuit is configured to be connected with the first input end of the input balun, and the first end of the second linear feedback circuit is configured to be connected with the second input end of the input balun; or,
when the input balun is a double-ended radio-frequency signal input balun, the first end of the first linear feedback circuit is configured to be connected with the second input end of the input balun, and the first end of the second linear feedback circuit is configured to be connected with the first input end of the input balun.

In an embodiment, the first linear feedback circuit includes a first feedback capacitor, one end of the first feedback capacitor is connected with the input balun, and the other end thereof is connected with the first differential amplifying circuit;
the second linear feedback circuit includes a second feedback capacitor, one end of the second feedback capacitor is connected with the input balun, and the other end thereof is connected with the second differential amplifying circuit.

In an embodiment, the first linear feedback circuit includes a first feedback resistor and a first feedback capacitor connected in series, and the first feedback resistor is connected with the input balun, and the first feedback capacitor is connected with the first differential amplifying circuit;
the second linear feedback circuit includes a second feedback resistor and a second feedback capacitor connected in series, the second feedback resistor is connected to the input balun, and the second feedback capacitor is connected with the second differential amplifying circuit.

In an embodiment, the first differential amplifying circuit includes a first amplifying transistor, a first DC blocking capacitor, a first coupling resistor and a first bias circuit; a first end of the first amplifying transistor is connected with the first DC blocking capacitor, a second end of the first amplifying transistor is connected with the first input end of the output balun, and a third end of the first amplifying transistor is connected to a ground end; the first DC blocking capacitor is arranged between the first output end of the input balun and the first end of the first amplifying transistor; one end of the first coupling resistor is connected with the first bias circuit, the other end thereof is connected with a connection node between the first DC blocking capacitor and the first end of the first amplifying transistor; the second end of the first linear feedback circuit is connected with a connection node between the first coupling resistor and the first bias circuits;

the second differential amplifying circuit includes a second amplifying transistor, a second DC blocking capacitor, a second coupling resistor and a second bias circuit; a first end of the second amplifying transistor is connected with the second DC blocking capacitor, a second end of the second amplifying transistor is connected with the second input end of the output balun, and a third end of the second amplifying transistor is connected to the ground end; the second DC blocking capacitor is arranged between the second output end of the input balun and the first end of the second amplifying transistor; one end of the second coupling resistor is connected with the second bias circuit, and the other end thereof is connected with a connection node between the second DC blocking capacitor and the first end of the second amplifying transistor; the second end of the second linear feedback circuit is connected with a connection node between the second coupling resistor and the second bias circuit.

In an embodiment, the first bias circuit includes a first power supply and a first bias transistor; the first power supply is connected to the ground end; a first send of the first bias transistor is connected with a connection node between the first power supply and the ground end, a second end of the first bias transistor is connected with a power supply end of the first power supply, and a third end of the first bias transistor is connected with the first coupling resistor; the second bias circuit includes a second power supply and a second bias transistor, the second power supply is connected to the ground end; a first end of the second bias transistor is connected with a connection node between the second power supply and the ground end, a second end of the second bias transistor is connected with a power supply end of the second power supply, and a third end of the second bias transistor is connected with the second coupling resistor.

In an embodiment, the first bias circuit further includes a first voltage dividing unit arranged between the first power supply and the ground end, a connection node between the first power supply and the first voltage dividing unit is connected with the first end of the first bias transistor; the second bias circuit further includes a second voltage dividing unit arranged between the second power supply and the ground end, and a connection node between the second power supply and the second voltage dividing unit is connected with the first end of the second bias transistor.

In an embodiment, the first voltage dividing unit includes a first voltage dividing diode and a second voltage dividing diode connected in series, and an anode of the first voltage dividing diode is connected with the first power supply, and a cathode of the second voltage divider diode is connected to the ground end; the second voltage dividing unit includes a third voltage dividing diode and a fourth voltage dividing diode connected in series, an anode of the third voltage dividing diode is connected with the second power supply, and a cathode of the fourth voltage dividing diode is connected to the ground end.

The present disclosure also provides a radio-frequency module which having the above radio-frequency differential amplifying circuit.

In the radio-frequency differential amplifying circuit and the radio-frequency module of the present disclosure, the first linear feedback circuit is arranged between the input balun and the first differential amplifying circuit, and the second linear feedback circuit is arranged between the input balun and the second differential amplifying circuit. With the first linear feedback circuit and the second linear feedback circuit, on the basis of ensuring the basic circuit performance of the first differential amplifying circuit and the second differential amplifying circuit, the first differential amplifying circuit and the second differential amplifying circuit can substantially keep the same gain within their operating frequency bands, thereby improving the linearity of the radio-frequency differential amplifying circuit.

BRIEF DESCRIPTION OF THE FIGURES

Implementations of the present disclosure will now be described, by way of example only, with reference to the attached figures, wherein.

Figure 1:
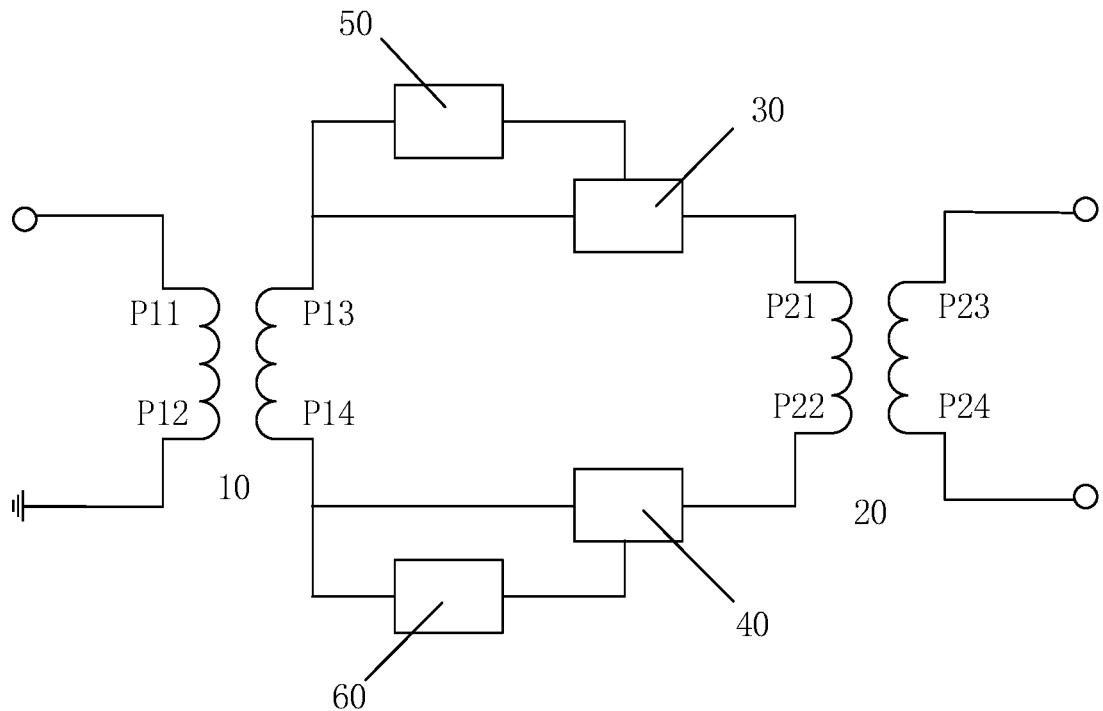
FIG. 1 is a circuit diagram of a radio-frequency differential amplifying circuit in accordance with an embodiment of the present disclosure.

Wherein marks and numbers shown in the drawings represent:

10, input balun; P21, first input end; P22, second input end; P23, first output end; P24, second output end; 30, first differential amplifying circuit; M1, first amplifying transistor; C1, first DC blocking capacitor; R1, first coupling resistor; 31, first bias circuit; I1, first power supply; Q1, first bias transistor; 311, first voltage dividing circuit; D1, first voltage dividing diode; D2, second voltage dividing diode; 40, second differential amplifying circuit; M2, second amplifying transistor; C2, second DC blocking capacitor; R2, second coupling resistor; 41, second bias circuit; I2, second power supply; Q2, second bias transistor; 411, second voltage dividing circuit; D3, third voltage dividing diode; D4, fourth voltage dividing diode; 50, first linear feedback circuit; C3, first feedback capacitor; R3, first feedback resistor; 60, second linear feedback circuit; C4, second feedback capacitor; and, R4, second feedback resistor.

DETAILED DESCRIPTION

To make a person skilled in the art better understand the technical solutions in the present application, the following clearly and completely describes the technical solutions in the embodiments of the present application with reference to the accompanying drawings in the embodiments of the present application. Apparently, the described embodiments are merely a part rather than all of the embodiments of the present application. All other embodiments obtained by a person of ordinary skill in the art based on the embodiments of the present application without creative efforts shall fall within the protection scope of the present application.

It should be understood that this invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element or layer is referred to as being "on", "adjacent", "connected to", or "coupled to" another element or layer, it can be directly on, adjacent, connected or coupled to the other element or layer or intervening elements or layers may be present. In contrast, when an element is referred to as being "directly on", "directly adjacent", "directly connected to", or "directly coupled to" another element or layer, there are no intervening elements or layers present. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

In the following description, specific details are set forth in order to provide a thorough understanding of the present invention. It will be apparent, however, to one skilled in the art that the invention can be practiced without regard to these specific details. In other instances, well known concepts have not been described in detail in order to avoid obscuring the present invention.

The present disclosure provides a radio-frequency differential amplifying circuit. As shown from FIGS. 1 to 7, the radio-frequency differential amplifying circuit includes an input balun 10, an output balun 20, a first differential amplifying circuit 30, a second differential amplifying circuit 40, a first linear feedback circuit 50 and a second linear feedback circuit 60. The first differential amplifying circuit 30 is arranged between a first output end P13 of the input balun 10 and a first input end P21 of the output balun 20. The second differential amplifying circuit 40 is arranged between a second output end P14 of the input balun 10 and a second input end P22 of the output balun 20. A first end of the first linear feedback circuit 50 is connected with the input balun 10, and a second end of the first linear feedback circuit 50 is connected with the first differential amplifying circuit 30. A first end of the second linear feedback circuit 60 is connected with the input balun 10, and a second end of the second linear feedback circuit 60 is connected with the second differential amplifying circuit 40.

The input balun 10 includes a first input end P11, a second input end P12, the first output end P13 and the second output end P14. Correspondingly, the output balun 20 includes the first input end P21, a second input end P22, a first output end P23 and a second output end P24.

In the embodiment, the input balun 10 converts an unbalanced radio-frequency signal received by the first input end P11 and/or the second input end P12 to a balanced radio-frequency signal. The input balun 10 then sends the balanced radio-frequency signal to the first differential amplifying circuit 30 and the second differential amplifying circuit 40 respectively through the first output end P13 and the second output end P14. The first differential amplifying circuit 30 and the second differential amplifying circuit 40 receive and amplify the balanced radio-frequency signals outputted by the first output end P13 and the second output end P14 respectively to form amplified balanced radio-frequency signals. The amplified balanced radio-frequency signals are transmitted to the first input end P21 and the second input end P22 of the output balun 20. The output balun 20 converts the amplified balanced radio-frequency signals to amplified unbalanced radio-frequency signals which are then sent to a subsequent circuit through the first output end P23 and the second output end P24 of the output balun 20. The first linear feedback circuit 50 is arranged between the input balun 10 and the first differential amplifying circuit 30, and the second linear feedback circuit 60 is arranged between the input balun 10 and the second differential amplifying circuit 40, thus, the first linear feedback circuit 50 and the second linear feedback circuit 60 can optimize the input radio-frequency signals, which effectively improves an amplification factor of the radio-frequency differential amplifying circuit, reduces a distortion of the radio-frequency signals, thereby ensuring a basic circuit performance of the first differential amplifying circuit 30 and the second differential amplifying circuit 40. Moreover, the radio-frequency differential amplifying circuit amplifies the input radio-frequency signal to have a required amplitude, and a changing rule of the amplified radio-frequency signal is consistent with that of the original input radio-frequency signal, thus, a gain balance of the radio-frequency differential amplifying circuit can be achieved to improve a linearity of the differential amplifying circuit.

In one embodiment, as shown in FIG. 1, when the input balun 10 is a single-ended radio-frequency signal input balun, the first end of the first linear feedback circuit 50 is configured to be connected with the first output end P13 of the input balun 10, and the first end of the second linear feedback circuit 60 is configured to be connected with the second output end P14 of the input balun 10.

As shown in FIG. 1, when the input balun 10 is a single-ended radio-frequency signal input balun, that is, any one of the first input end P11 and the second input end P12 of the input balun 10 receives the radio-frequency signal, and the other input end of the input balun 10 is connected with a ground end. The first end of the first linear feedback circuit 50 is configured to be connected with the first output end P13 of the input balun 10, and the first end of the second linear feedback circuit 60 is configured to be connected with the second output end P14 of the input balun 10. That is, the first linear feedback circuit 50 is arranged between the first output end P13 of the input balun 10 and the first differential amplifying circuit 30, which ensures that the first differential amplifying circuit 30 can keep the same gain within its operating frequency band during the signal amplifying process to achieve an ideal linearity. Correspondingly, the second linear feedback circuit 60 is arranged between the second output end P14 of the input balun 10 and the second differential amplifying circuit 40, which ensures that the second differential amplifying circuit 40 can keep the same gain within its operating frequency band during the signal amplifying process to achieve an ideal linearity.

Figure 2:
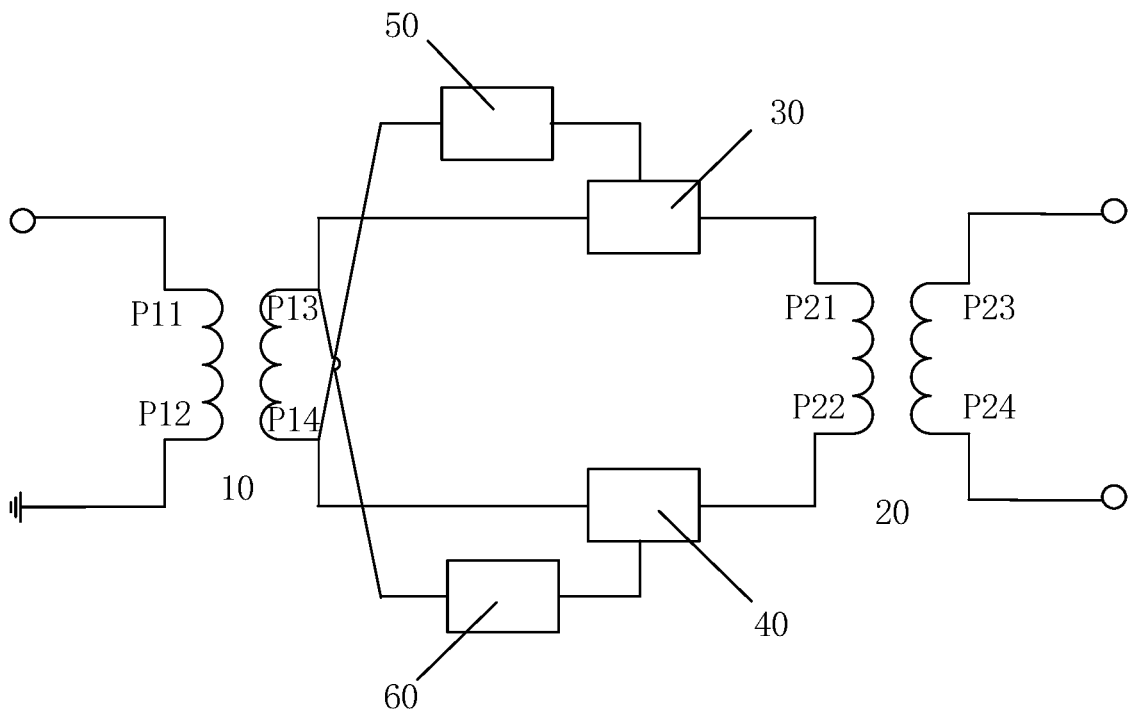
FIG. 2 is a circuit diagram of a radio-frequency differential amplifying circuit in accordance with another embodiment of the present disclosure.

In one embodiment, as shown in FIG. 2, when the input balun 10 is a single-ended radio-frequency signal input balun, the first end of the first linear feedback circuit 50 is configured to be connected with the second output end P14 of the input balun 10, and the first end of the second linear feedback circuit 60 is configured to be connected with the first output end P13 of the input balun 10.

As shown in FIG. 2, when the input balun 10 is a single-ended radio-frequency signal input balun, that is, any one of the first input end P11 and the second input end P12 of the input balun 10 receives the radio-frequency signal, and the other input end of the input balun 10 is connected with the ground end. At this time, the first end of the first linear feedback circuit 50 is configured to be connected with the second output end P14 of the input balun 10, and the first end of the second linear feedback circuit 60 is configured to be connected with the first output end P13 of the input balun 10. Since there may be a certain degree of phase and power imbalance between balanced ends (the first output end P13 and the second output end P14) of the input balun 10 under non-ideal conditions, in this embodiment, the linear feedback circuit 50 is arranged between the second output end P14 of the input balun 10 and the first differential amplifying circuit 30, and the second linear feedback circuit 60 is arranged between the first output end P13 of the input balun 10 and the second differential amplifying circuit 40, which further ensures the balance of the balanced ends (the first output end P13 and the second output end P14) of the input balun, ensures the powers of the radio-frequency signals of the first output end P13 and the second output end P14 to be the same, and ensures that the first differential amplifying circuit 30 can substantially keep the same gain within its working frequency band during the signal amplifying process, to achieve an ideal linearity.

It is understood that when the input balun 10 is a single-ended radio-frequency signal input balun, since only one of the two input ends of the input balun 10 receives the radio-frequency signal, the input balun does not form two radio-frequency signals respectively sent to the first linear feedback circuit 50 and the second feedback circuit 60. Therefore, when the input balun 10 is a single-ended radio-frequency signal input balun, the first end of the first linear feedback circuit 50 and the first end of the second linear feedback circuit 60 can only be configured to be connected with the first output end P13 or the second output end P14 of the input balun 10. It is understood that, when the input balun 10 is a single-ended radio-frequency signal input balun, the radio-frequency signal received by the input end of the input balun 10 is an unbalanced radio-frequency signal, that is, the signals received by the first input end P11 and the second input end P12 of the input balun 10 are different. If the first end of the first linear feedback circuit 50 and the first end of the second linear feedback circuit 60 are configured to be connected with the first input end P11 and the second input end P12 of the input balun 10 respectively, the RF differential amplifying circuit cannot work normally.

Figure 3:
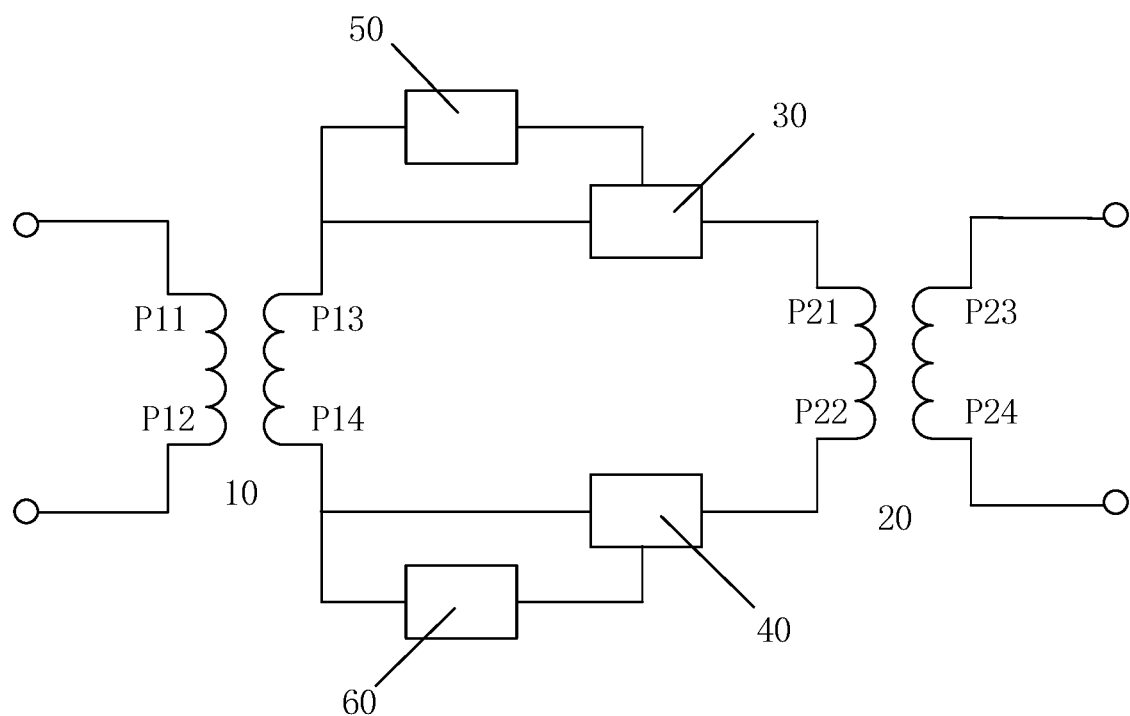
FIG. 3 is a circuit diagram of a radio-frequency differential amplifying circuit in accordance with another embodiment of the present disclosure.

In one embodiment, as shown in FIG. 3, when the input balun 10 is a double-ended radio-frequency signal input balun, the first end of the first linear feedback circuit 50 is configured to be connected with the first output end P13 of the input balun 10, and the first end of the second linear feedback circuit 60 is configured to be connected with the second output end P14 of the input balun 10.

As shown in FIG. 3, when the input balun 10 is a double-ended radio-frequency signal input balun, that is, the first input end P11 and the second input end P12 of the input balun 10 respectively receive a radio-frequency signal, and neither of the input ends of the input balun 10 are grounded. At this time, the first end of the first linear feedback circuit 50 is configured to be connected with the first output end P13 of the input balun 10, and the first end of the second linear feedback circuit 60 is configured to be connected with the second output end P14 of the input balun 10. That is, the first linear feedback circuit 50 is arranged between the first output end P13 of the input balun 10 and the first differential amplifying circuit 30, which ensures that the first differential amplifying circuit 30 can substantially keep the same gain within its operating frequency band during the signal amplifying process to achieve an ideal linearity. Correspondingly, the second linear feedback circuit 60 is arranged between the second output end P14 of the input balun 10 and the second differential amplifying circuit 40, which ensures that the second differential amplifying circuit 40 can substantially keep the same gain during the signal amplifying process within its frequency band to achieve an ideal linearity.

Figure 4:
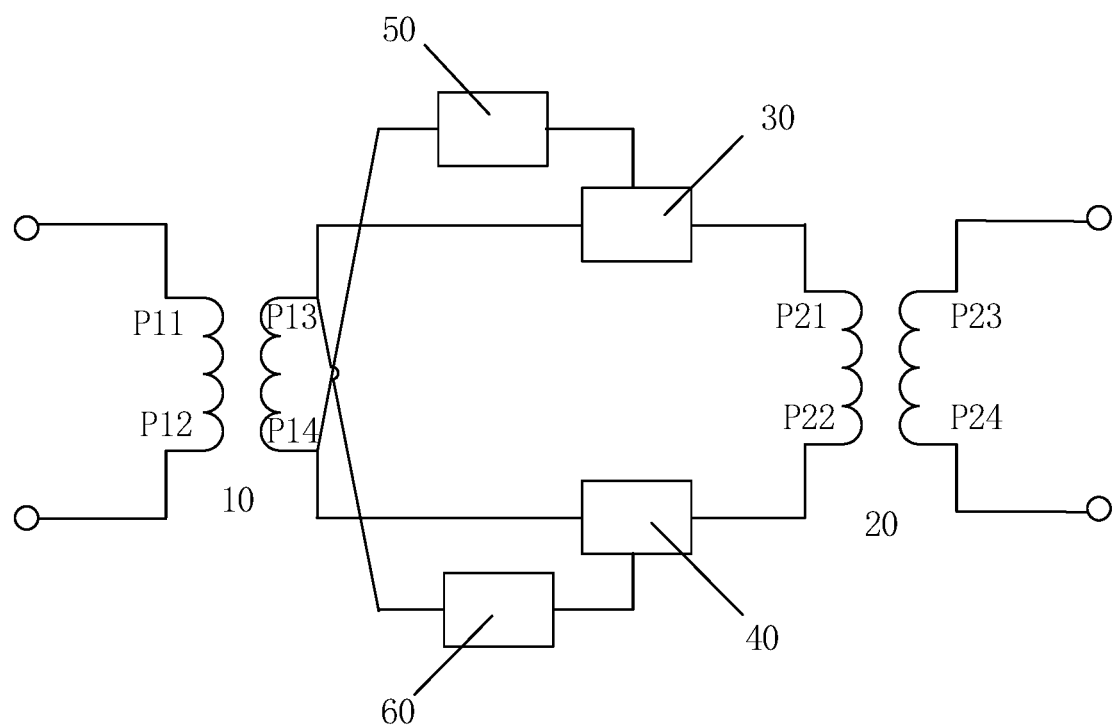
FIG. 4 is a circuit diagram of a radio-frequency differential amplifying circuit in accordance with another embodiment of the present disclosure.

In one embodiment, as shown in FIG. 4, when the input balun 10 is a double-ended radio-frequency signal input balun, the first end of the first linear feedback circuit 50 is configured to be connected with the second output end P14 of the input balun 10, and the first end of the second linear feedback circuit 60 is configured to be connected with the first output end P13 of the input balun 10.

As shown in FIG. 4, when the input balun 10 is a double-ended radio-frequency signal input balun, that is, the first input end P11 and the second input end P12 of the input balun 10 respectively receive a radio-frequency signal, and neither of the input ends of the input balun 10 are grounded. At this time, the first end of the first linear feedback circuit 50 is configured to be connected with the second output end P14 of the input balun 10, and the first end of the second linear feedback circuit 60 is configured to be connected with the first output end P13 of the input balun 10. Since there may be a certain degree of phase and power imbalance between the balanced ends (the first output end P13 and the second output end P14) of the input balun 10 under non-ideal conditions, in this embodiment the first linear feedback circuit 50 is arranged between the second output end P14 of the input balun 10 and the first differential amplifying circuit 30, and the second linear feedback circuit 60 is arranged between the first output end P13 of the input balun 10 and the second differential amplifying circuits 40, which further ensures the balance of the balanced ends (the first output end P13 and the second output end P14) of the input balun, ensures that the powers of the radio-frequency signals output by the first output end P13 and the second output end P14 are the same, and thus ensures that the first differential amplifying circuit 30 can substantially keep the same gain in its working frequency band during the signal amplifying process, to achieve an ideal linearity.

Figure 5:
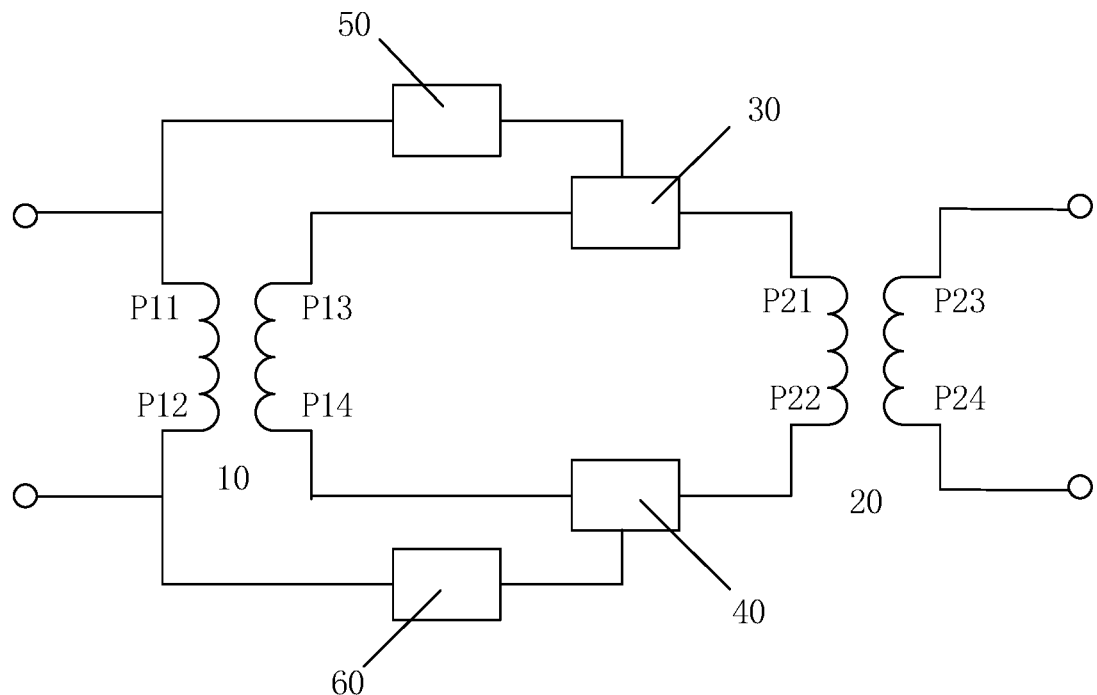
FIG. 5 is a circuit diagram of a radio-frequency differential amplifying circuit in accordance with another embodiment of the present disclosure.

In one embodiment, as shown in FIG. 5, when the input balun 10 is a double-ended radio-frequency signal input balun, the first end of the first linear feedback circuit 50 is configured to be connected with the first input end P11 of the input balun 10, and the first end of the second linear feedback circuit 60 is configured to be connected with the second input end P12 of the input balun 10.

As shown in FIG. 5, the input balun 10 is a double-ended radio-frequency signal input balun, that is, the first input end P11 and the second input end P12 of the input balun 10 respectively receive a radio-frequency signal, and neither of input ends of the input balun are grounded. At this time, the first end of the first linear feedback circuit 50 is configured to be connected with the first input end P11 of the input balun 10, and the first end of the second linear feedback circuit 60 is configured to be connected with second input end P12 of the input balun 10. That is, the first linear feedback circuit 50 is arranged between the first input end P11 of the input balun 10 and the first differential amplifying circuit 30, which ensures that the first differential amplifying circuit 30 can substantially keep the same gain within its operating frequency band during the signal amplifying process to achieve an ideal linearity. Correspondingly, the second linear feedback circuit 60 is arranged between the second input end P12 of the input balun 10 and the second differential amplifying circuit 40, which ensures that the second differential amplifying circuit 40 can substantially keep the same gain within its operating frequency band during the signal amplification processing to achieve an ideal linearity.

Figure 6:
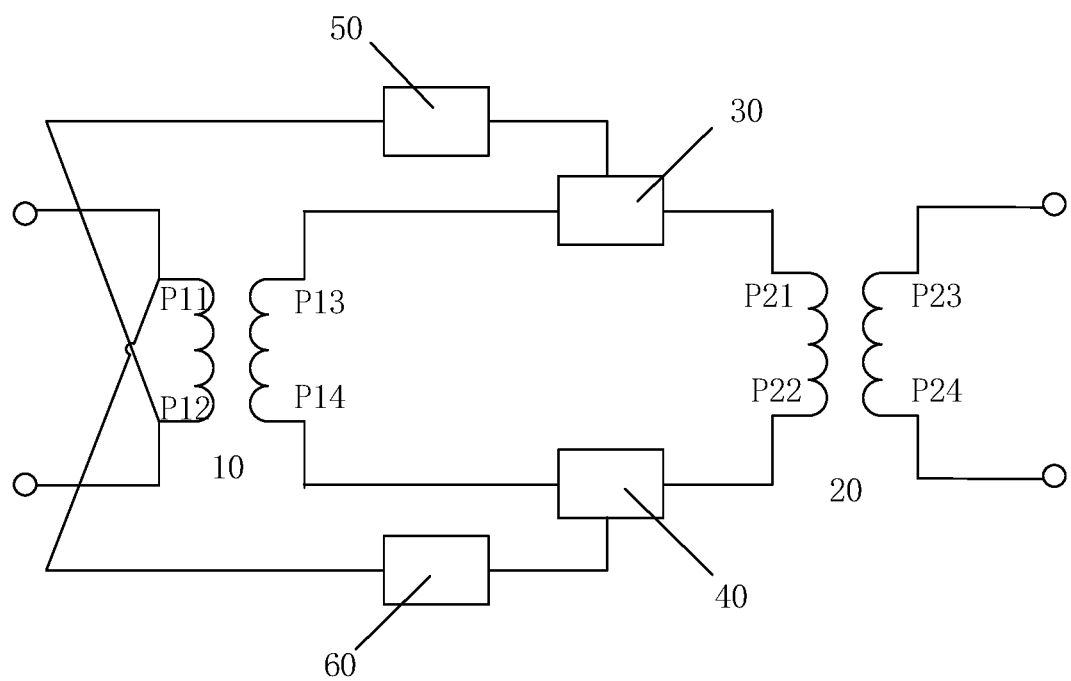
FIG. 6 is a circuit diagram of a radio-frequency differential amplifying circuit in accordance with another embodiment of the present disclosure.

In one embodiment, as shown in FIG. 6, when the input balun 10 is a double-ended radio-frequency signal input balun, the first end of the first linear feedback circuit 50 is configured to be connected with the second input end P12 of the input balun 10, and the first end of the second linear feedback circuit 60 is configured to be connected with the first input end P11 of the input balun 10.

As shown in FIG. 6, the input balun 10 is a double-ended radio-frequency signal input balun, that is, the first input end P11 and the second input end P12 of the input balun 10 respectively receive a radio-frequency signal, and neither of the input ends of the input balun are grounded. At this time, the first end of the first linear feedback circuit 50 is configured to be connected with the second input end P12 of the input balun 10, and the first end of the second linear feedback circuit 60 is configured to be connected with the first input end P11 of the input balun 10. Since there may be a certain degree of phase and power imbalance between the first input end P11 and the second input end P12 of the input balun 10 under non-ideal conditions, in this embodiment, the first linear feedback circuit 50 is arranged between the second input end P12 of the input balun 10 and the first differential amplifying circuit 30, and the second linear feedback circuit 60 is arranged between the first input end P11 of the input balun 10 and the second differential amplifying circuit 40, which ensures the balance of the first input end P11 and the second input end P12 of the input balun, ensures the same powers of the radio-frequency signals output by the first input end P11 and the second input end P12 of the input balun, and thus ensures that the first differential amplifying circuit 30 can substantially keep the same gain within its operating frequency band during the signal amplification process, to achieve an ideal linearity.

It is understood that, when the input balun 10 is a double-ended radio-frequency signal input balun, since the two input ends of the input balun 10 respectively receives a radio-frequency signal and the radio-frequency signals can be respectively sent to the first linear feedback circuit 50 and the second linear feedback circuit 60, therefore, the first end of the first linear feedback circuit 50 and the first end of the second linear feedback circuit 60 not only can be configured to be connected with the first output end P13 or the second output end P14 of the input balun 10, and also can be configured to be connected with the first input end P11 or the second input end P12 of the input balun 10. It is understood that, when the input balun 10 is a double-ended radio-frequency signal input balun, the signal input to the first input end P11 is the same as that signal input to the second input end P12 of the input balun 10, and the signal output by the first output end P13 is the same as the signal output by the second output end P14 of the input balun 10. Therefore, the first end of the first linear feedback circuit 50 and the first end of the second linear feedback circuit 60 can be configured to be respectively connected with the two input ends of the input balun at the same time, or can be configured to be respectively connected with two output ends of the input balun to ensure that the radio-frequency differential amplifying circuit can work normally.

Figure 7:
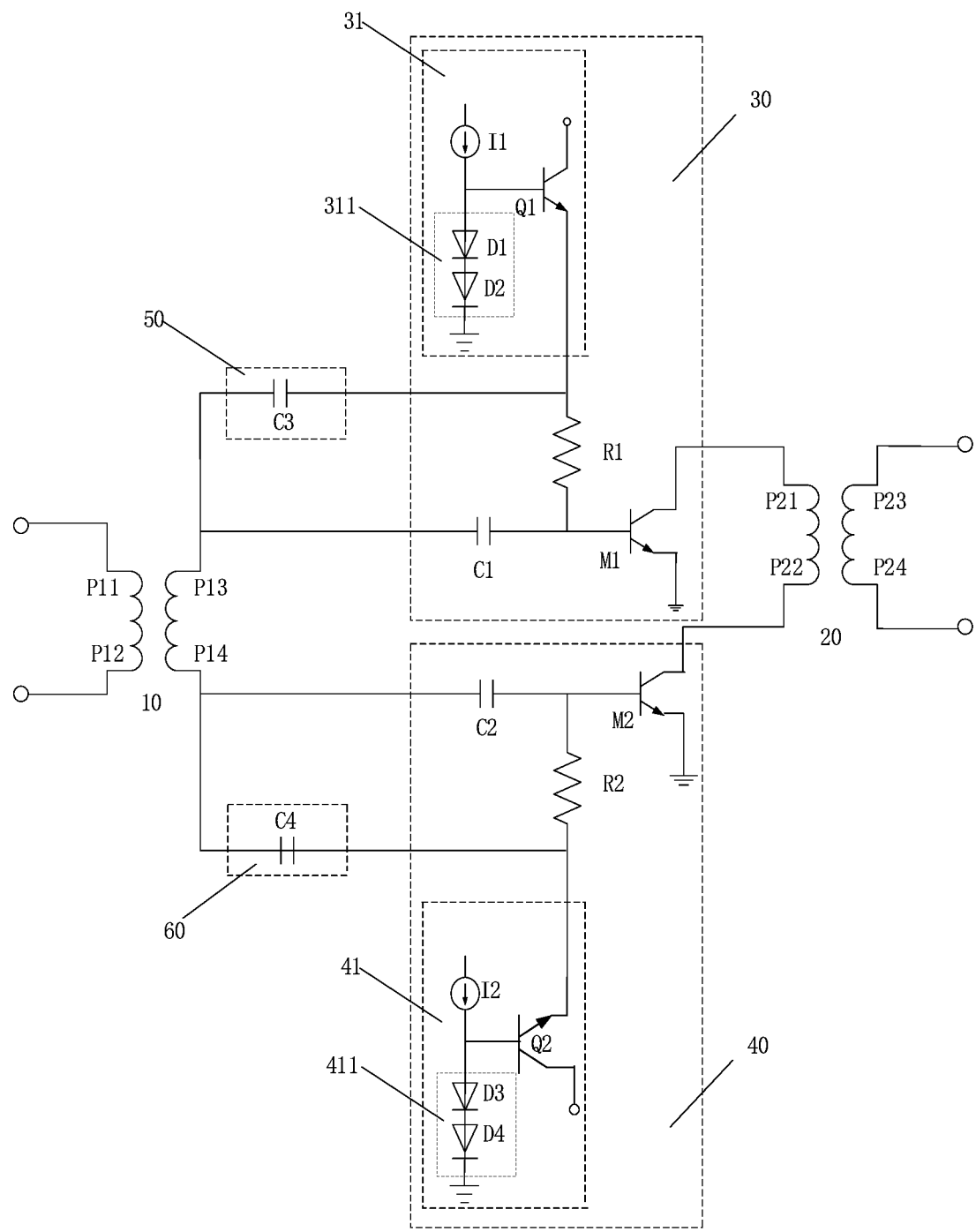
FIG. 7 is a circuit diagram of a radio-frequency differential amplifying circuit in accordance with another embodiment of the present disclosure.

In one embodiment, as shown in FIG. 7, the first linear feedback circuit 50 includes a first feedback capacitor C3, one end of the first feedback capacitor C3 is connected with the input balun 10, and the other end thereof is connected with the first differential amplifying circuit 30. The second linear feedback circuit 60 includes a second feedback capacitor C4, one end of the second feedback capacitor C4 is connected with the input balun 10, and the other end thereof is connected with the second differential amplifying circuit 40.

In this embodiment, both the first feedback capacitor C3 and the second feedback capacitor C4 can block a DC current. That is, both the first feedback capacitor C3 and the second feedback capacitor C4 can block the current, and impedances of the first feedback capacitor C3 and the second feedback capacitor are determined by capacitive resistances thereof and change with the frequency. During the signal amplification processes of the first differential amplifying circuit 30 and the second differential amplifying circuit 40, due to the first feedback capacitor C3 and the second feedback capacitor C4, the first differential amplifying circuit 30 and the second differential amplifying circuit 40 can substantially keep the same gain within their operating frequency bands, thereby improving the linearity of the radio-frequency differential amplifying circuit. It is understood that the embodiments shown from FIG. 1 to FIG. 6 can be referred for the connection manner of the first feedback capacitor C3 and the second feedback capacitor C4.

Figure 8:
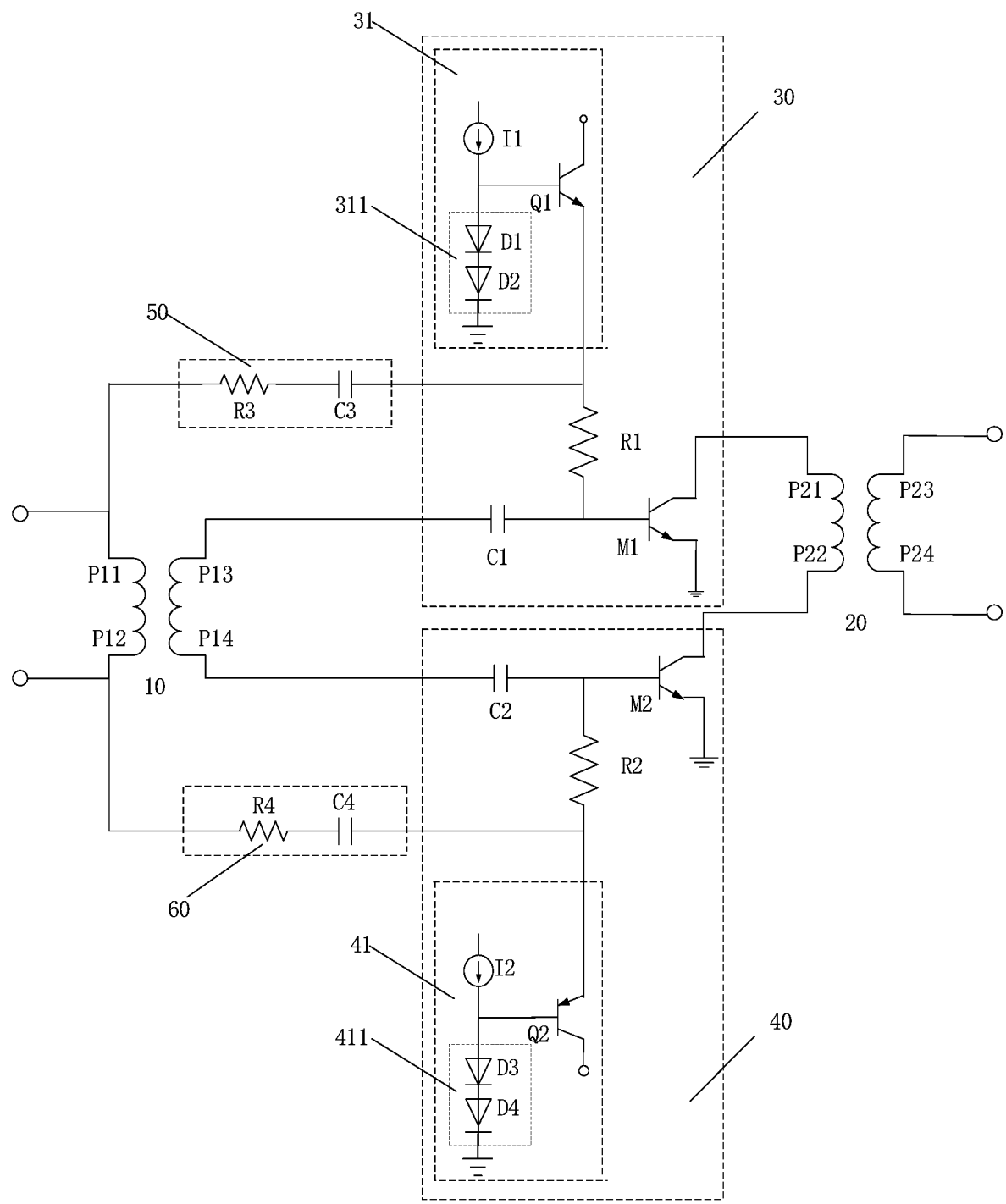
FIG. 8 is a circuit diagram of a radio-frequency differential amplifying circuit in accordance with another embodiment of the present disclosure.

In one embodiment, as shown in FIG. 8, the first linear feedback circuit 50 includes a first feedback resistor R3 and the first feedback capacitor C3 connected in series, the first feedback resistor R3 is connected with the input balun 10, and the first feedback capacitor C3 is connected with the first differential amplifying circuit 30. The second linear feedback circuit 60 includes a second feedback resistor R4 and the second feedback capacitor C4 connected in series, the second feedback resistor R4 is connected with the input balun 10, and the second feedback capacitor C4 is connected with the second differential amplifying circuit 60.

In this embodiment, the first feedback resistor R3 and the first feedback capacitor C3 are connected in series. Since the first feedback capacitor C3 can block the DC current, the first linear feedback circuit 50 formed by the first feedback resistor R3 and the first feedback capacitor C3 also can block the current, and a total impedance of the first linear feedback circuit 50 is determined by an impedance of the first feedback resistor R3 and the capacitive reactance of the first feedback capacitor C3, which also changes with the frequency. Understandably, during the signal amplifying process of the first differential amplifying circuit 30, with the first feedback resistor R3 and the second feedback capacitor C4, the first differential amplifying circuit 30 can substantially keep the same gain within its operating frequency band, thereby improving the linearity of the RF differential amplifying circuit.

Correspondingly, the second feedback resistor R4 and the second feedback capacitor C4 are connected in series; since the second feedback capacitor C4 can block the DC current, the second linear feedback circuit 40 formed by the second feedback resistor R4 and the second feedback capacitor C4 also can block the current, and a total impedance of the second linear feedback circuit 60 is determined by an impedance of the second feedback resistor R4 and the capacitive reactance of the second feedback capacitor C4, which changes with the frequency. Understandably, during the signal amplifying process of the second differential amplifying circuit 40, with the second feedback resistor R4 and the second feedback capacitor C4, the second differential amplifying circuit 40 can substantially keep the same gain within its operating frequency band, thereby improving the linearity of the radio-frequency differential amplifying circuit.

In one embodiment, as shown in FIG. 7 and FIG. 8, the first differential amplifying circuit 30 includes a first amplifying transistor M1, a first DC blocking capacitor C1, a first coupling resistor R1 and a first bias circuit 31. A first end of the first amplifying transistor M1 is connected with the first DC blocking capacitor C1, a second end of the first amplifying transistor M1 is connected with the first input end P21 of the output balun 20, and a third end of the first amplifying transistor M1 is grounded. The first DC blocking capacitor C1 is arranged between the first output end P13 of the input balun 10 and the first end of the first amplifying transistor M1. One end of the first coupling resistor R1 is connected with the first bias circuit 31, and the other end thereof is connected with a connection node between the first DC blocking capacitor C1 and the first end of the first amplifying transistor M1. The second end of the first linear feedback circuit 50 is connected with a connection node between the first coupling resistor R1 and the first bias circuit 31.

In this embodiment, the first bias circuit 31 is used to form a first bias current, so that an emitter junction of the first amplifying transistor M1 is forward-biased and a collector junction of the first amplifying transistor M1 is reverse-biased, ensuring that the first amplifying transistor M1 can amplify the signal without distortion. In an embodiment, the first bias current output by the first bias circuit 31 is coupled to the first end of the first amplifying transistor M1 through the first coupling resistor R1, and the first DC blocking capacitor C1 blocks the DC current, thus, the first end, the second end and the third end of the first amplifying transistor M1 are at required potentials, allowing the emitter junction of the first amplifying transistor M1 to be forward-biased and the collector junction thereof to be reverse-biased, thereby ensuring that the signal can be amplified through the first amplifying transistor M1 without distortion.

Correspondingly, the second differential amplifying circuit 40 includes a second amplifying transistor M2, a second DC blocking capacitor C2, a second coupling resistor R2 and a second bias circuit 41. A first end of the second amplifying transistor M2 is connected with the second DC blocking circuit 41, a second end of the second amplifying transistor M2 is connected with the second input end P22 of the output balun 20, and a third end of the second amplifying transistor M2 is grounded. The second DC blocking capacitor C2 is arranged between the second output end P14 of the input balun 10 and the first end of the second amplifying transistor M2. One end of the second coupling resistor R2 is connected with the second bias circuit 41, and the other end thereof is connected with a connection node between the second DC blocking capacitor C2 and the second amplifying transistor M2. The second end of the second linear feedback circuit 60 is connected with a connection node between the second coupling resistor R2 and the second bias circuit 41.

In this embodiment, the second bias circuit 41 is used to form a second bias current, so that an emitter junction of the second amplifying transistor M2 is forward-biased and a collector junction thereof is reverse-biased, ensuring that the second amplifying transistor M2 can amplify the signal without distortion. In an embodiment, the second bias current output by the second bias circuit 41 is coupled to the first end of the second amplifying transistor M2 through the second coupling resistor R2, and the second DC blocking capacitor C2 blocks the DC current, thus, the first, the second and the third ends of the second amplifying transistor M2 are at required potentials, allowing the emitter junction of the second amplifying transistor M2 to be forward-biased and the collector junction thereof to be reverse-biased, thereby ensuring the first amplifying transistor M1 can amplify the signal without distortion.

As an example, both the first amplifying transistor M1 and the second amplifying transistor M2 may be triodes. In an embodiment, when the first amplifying transistor M1 and the second amplifying transistor M2 are triodes, the first end of the first amplifying transistor M1 and the first end of the second amplifying transistor M2 are substrates of the triodes, the second end of the first amplifying transistor M1 and the second end of the second amplifying transistor M2 are collectors of the triodes, the third end of the first amplifying transistor M1 and the third end of the second amplifying transistor M2 are emitters of the triodes.

As another example, both the first amplifying transistor M1 and the second amplifying transistor M2 may be MOS transistors. In an embodiment, when the first amplifying transistor M1 and the second amplifying transistor M2 are MOS transistors, the first end of the first amplifying transistor M1 and the second end of the second amplifying transistor M2 are gates of the MOS transistors, the second end of the first amplifying transistor M1 and the second end of the second amplifying transistor M2 are drains of the MOS transistors, and the third end of the first amplifying transistor M1 and the third end of the second amplifying transistor M2 are sources of the MOS transistors.

In this embodiment, a triode or a MOS transistor can be used as the first amplifying transistor M1 and the second amplifying transistor M2 according to the actual situation.

In one embodiment, as shown in FIG. 6 and FIG. 7, the first bias circuit 31 includes a first power supply I1 and a first bias transistor Q1. The first power supply I1 is connected to the ground end. A first end of the first bias transistor Q1 is connected with a connection node between the first power supply I1 and the ground end, a second end of the first bias transistor Q1 is connected with a power supply end of the first power supply I1, and a third end of the first bias transistor Q1 is connected with the first coupling resistor R1. The second bias circuit 41 includes a second power supply I2 and a second bias transistor Q2. The second power supply I2 is connected with the ground end. A first end of the second bias transistor Q2 is connected with a connection node between the second power supply I2 and the ground end, a second end of the second bias transistor Q2 is connected with a power supply end of the second power supply I2, and a third end of the second bias transistor Q2 is connected with the second coupling resistor R2.

The first bias circuit 31 is used to form the first bias current and provide the first bias current to the first amplifying transistor M1, so that the first amplifying transistor M1 can amplify the signal without distortion according to the first bias current. The first power supply I1 is used to provide an input current. In this example, the input current provided by the first power supply I1 can be directly applied to the first end of the first bias transistor Q1, so that the first bias current can be input to the first coupling resistor R1 through the third end of the first bias transistor Q1 and then coupled to the input end of the first amplifying transistor M1 through the coupling resistor R1.

The second bias circuit 41 is used to form the second bias current and provide the second bias current to the second amplifying transistor M2, so that the second amplifying transistor M2 can amplify the signal without distortion according to the second bias current. The second power supply I2 is used to provide the input current. In this example, the input current provided by the second power supply I2 can be directly applied to the first end of the second bias transistor Q2, so that the second bias current can be input to the coupling resistor R2 through the third end of the second bias transistor Q2 and then coupled to the input end of the second amplifying transistor M2 through the second coupling resistor R2.

It is understood that, the first power supply I1 and the second power supply I2 may be the same power supply, or may be different power supplies according to actual needs. The first power supply I1 and the second power supply I2 may be constant current sources to provide constant currents as input currents to ensure the stability of the first bias current and the second bias current.

As an example, both the first bias transistor Q1 and the second bias transistor Q2 may be triodes. In an embodiment, when the first bias transistor Q1 and the second bias transistor Q2 are triodes, the first end of the first bias transistor Q1 and the first end of the second bias transistor Q2 are bases of the triodes, the second end of the first bias transistor Q1 and the second end of the second bias transistor Q2 are collectors of the triodes, and the second end of the bias transistor Q2 and the second end of the second bias transistor Q2 are collectors of the triodes, and the third end of the first bias transistor Q1 and the third end of the second bias transistor Q2 are emitters of the triodes.

As another example, both the first bias transistor Q1 and the second bias transistor Q2 may be MOS transistors. In an embodiment, when the first bias transistor Q1 and the second bias transistor Q2 are MOS transistors, the first end of the first bias transistor Q1 and the first end of the second bias transistor Q2 are gates of the MOS transistors, and the second end of the first bias transistor Q1 and the second end of the second bias transistor Q2 are drains of the MOS transistors, and the third end of the first bias transistor Q1 and the third end of the second bias transistor Q2 are sources of the MOS transistors.

In an embodiment, as shown in FIG. 3, the first bias circuit 31 further includes a first voltage dividing unit 311 arranged between the first power supply I1 and the ground end. A connection node between the first power supply I1 and the first voltage dividing is connected with the first end of the first bias transistor Q1. The second bias circuit 41 further includes a second voltage dividing unit 411 arranged between the second power supply I2 and the ground end. A connection node between the power supply I2 and the second voltage dividing unit 411 is connected with the first end of the second bias transistor Q2.

In this example, the first voltage dividing unit 311 is further provided and is arranged the first power supply I1 and the ground end, and the connection node between the first power supply I1 and the first voltage dividing unit 311 is connected with the first end of the first bias transistor Q1, so that the input current from the first power supply I1 is divided by the first voltage dividing unit 311, and then applied to the first end of the first bias transistor Q1, thus the first bias current can be input to the first coupling resistor R1 through the third end of the first bias transistor Q1. Understandably, a static operating point of the first bias current can be stabilized through the voltage division of the first voltage dividing unit 311.

In this example, the second voltage dividing unit 411 is further provided and is arranged between the second power supply I2 and the ground end, and the connection node between the second power supply I2 and the second voltage dividing unit 411 is connected with the first end of the second bias transistor Q2, so that the input current from the second power supply I2 is divided by the second voltage dividing unit 411, and then applied to the first end of the second bias transistor Q2, thus the second bias current can be input to the first coupling resistor R1 through the third end of the second bias end. Understandably, a static operating point of the second bias current can be stabilized through the voltage division of the second voltage dividing unit 411.

In one embodiment, the first voltage dividing unit 311 includes a first voltage dividing diode D1 and a second voltage dividing diode D2 connected in series. An anode of the first voltage dividing diode D1 is connected with the first power supply I1, and a cathode of the second voltage dividing diode D2 is connected with the ground end. The second voltage dividing unit 411 includes a third voltage dividing diode D3 and a fourth voltage dividing diode D4 connected in series. An anode of the third voltage dividing diode D3 is connected with the second power supply I2, and a cathode of the fourth voltage dividing diode D3 is connected with the ground end.

In this example, the first voltage dividing unit 311 includes the first voltage dividing diode D1 and the second voltage dividing diode D2. The anode of the first voltage dividing diode D1 is connected with the first power supply I1, the cathode of the first voltage dividing diode D1 is connected with the anode of the second voltage dividing diode D2, the cathode of the second voltage dividing diode D2 is connected to the ground end, and the connection node between the first power supply I1 and the first voltage dividing diode D1 is connected with the first end of the first bias transistor Q1, so that the input current of the first power supply I1 is input to the first end of the first bias transistor Q1 after being processed by the first voltage dividing unit 311 formed by the first voltage dividing diode D1 and the second voltage dividing diode D2, allowing the first bias transistor Q1 to form the first bias current.

In this example, the second voltage dividing unit 411 includes the third voltage dividing diode D3 and the fourth voltage dividing diode D4, the anode of the third voltage dividing diode D3 is connected to the second power supply I2, the cathode of the third voltage dividing diode D3 is connected with the anode of the fourth voltage dividing diode D4, the cathode of the fourth voltage dividing diode D4 is connected with the ground end, and the connection node between the second power supply I2 and the third voltage dividing diode D3 is connected with the first end of the second bias transistor Q2, so that the input current of the second power supply I2 is input to the second bias transistor Q2 after being processed by the second voltage dividing unit 411 formed by the third voltage dividing diode D3 and the fourth voltage dividing diode D4, allowing the second bias transistor Q2 to form the second bias current.

The present disclosure further provides a radio-frequency module, which includes the radio-frequency differential amplifying circuit in the above embodiments. The input balun 10 converts the radio-frequency signal received by the first input end P11 and/or the second input end P12 from an unbalanced radio-frequency signal to a balanced radio-frequency signal. The balanced radio-frequency signal is then sent to the first differential amplifying circuit 30 and the second differential amplifying circuit 40 through the first output end P13 and the second output end P14 respectively. The first differential amplifying circuit 30 and the second differential amplifying circuit 40 respectively amplifies the balanced radio-frequency signals from the first output end P13 and the second output end P14 to form amplified balanced radio-frequency signals. The amplified balanced radio-frequency signals are transmitted to the first input end P21 and the second input end P22 of the output balun 20, and the output balun 20 converts the amplified balanced radio-frequency signals to amplified unbalanced radio-frequency signals, which are then sent to the subsequent circuit through the first output end P23 and the second output end P24 of the output balun 20. The first linear feedback circuit 50 is arranged between the input balun 10 and the first differential amplifying circuit 30, and the second linear feedback circuit 60 is arranged between the input balun 10 and the second differential amplifying circuit 40. With the first linear feedback circuit 50 and the second linear feedback circuit 60, on the basis of ensuring the basic circuit performance of the first differential amplifying circuit 30 and the second differential amplifying circuit 40, the first differential amplifying circuit 30 and the second differential amplifying circuit 40 can substantially keep the same gain within their operating frequency bands, thereby improving the linearity of the radio-frequency differential amplifying circuit.

The foregoing implementations are merely preferably embodiments of the present disclosure, and are not intended to limit the protection scope of the present disclosure. Any equivalent structure variation using the present disclosure and drawings, being directly or indirectly used in other related technical fields shall all fall into the protection scope of the present disclosure. Thus, the protection scope of the present disclosure shall be subjected to the protection scope of the claims.

What is claimed is:

1. A radio-frequency differential amplifying circuit, wherein the radio-frequency differential circuit comprises an input balun, an output balun, a first differential amplifying circuit, a second differential amplifying circuit, a first linear feedback circuit and a second linear feedback circuit; the first differential amplifying circuit is arranged between a first output end of the input balun and a first input end of the output balun; the second differential amplifying circuit is arranged between a second output end of the input balun and a second input end of the output balun; a first end of the first linear feedback circuit is connected with the input balun, a second end of the first linear feedback circuit is connected with the first differential amplifying circuit; a first end of the second linear feedback circuit is connected with the input balun, and a second end of the second linear feedback circuit is connected with the second differential amplifying circuit;

the first differential amplifying circuit comprises a first amplifying transistor, a first DC blocking capacitor, a first coupling resistor and a first bias circuit; a first end of the first amplifying transistor is connected with the first DC blocking capacitor, a second end of the first amplifying transistor is connected with the first input end of the output balun, and a third end of the first amplifying transistor is connected to a ground end; the first DC blocking capacitor is arranged between the first output end of the input balun and the first end of the first amplifying transistor; one end of the first coupling resistor is connected with the first bias circuit, the other end thereof is connected with a connection node between the first DC blocking capacitor and the first end of the first amplifying transistor; the second end of the first linear feedback circuit is connected with a connection node between the first coupling resistor and the first bias circuits; and the second differential amplifying circuit comprises a second amplifying transistor, a second DC blocking capacitor, a second coupling resistor and a second bias circuit; a first end of the second amplifying transistor is connected with the second DC blocking capacitor, a second end of the second amplifying transistor is connected with the second input end of the output balun, and a third end of the second amplifying transistor is connected to the ground end; the second DC blocking capacitor is arranged between the second output end of the input balun and the first end of the second amplifying transistor; one end of the second coupling resistor is connected with the second bias circuit, and the other end thereof is connected with a connection node between the second DC blocking capacitor and the first end of the second amplifying transistor; the second end of the second linear feedback circuit is connected with a connection node between the second coupling resistor and the second bias circuit.

2. The radio-frequency differential amplifying circuit according to claim 1, wherein when the input balun is a single-ended radio-frequency signal input balun, the first end of the first linear feedback circuit is configured to be connected with the first output end of the input balun, and the first end of the second linear feedback circuit is configured to be connected with the second output end of the input balun; or, when the input balun is a single-ended radio-frequency signal input balun, the first end of the first linear feedback circuit is configured to be connected with the second output end of the input balun, and the first end of the second linear feedback circuit is configured to be connected with the first output end of the input balun.

3. The radio-frequency differential amplifying circuit according to claim 1, wherein when the input balun is a double-ended radio-frequency signal input balun, the first end of the first linear feedback circuit is configured to be connected with the first output end of the input balun, and the first end of the second linear feedback circuit is configured to be connected with the second output end of the input balun; or, when the input balun is a double-ended radio-frequency signal input balun, the first end of the first linear feedback circuit is configured to be connected with the second output end of the input balun, and the first end of the second linear feedback circuit is configured to be connected with the first output end of the input balun; or, when the input balun is a double-ended radio-frequency signal input balun, the first end of the first linear feedback circuit is configured to be connected with the first input end of the input balun, and the first end of the second linear feedback circuit is configured to be connected with the second input end of the input balun; or, when the input balun is a double-ended radio-frequency signal input balun, the first end of the first linear feedback circuit is configured to be connected with the second input end of the input balun, and the first end of the second linear feedback circuit is configured to be connected with the first input end of the input balun.

4. The radio-frequency differential amplifying circuit according to claim 1, wherein the first linear feedback circuit comprises a first feedback capacitor, one end of the first feedback capacitor is connected with the input balun, and the other end thereof is connected with the first differential amplifying circuit;

the second linear feedback circuit comprises a second feedback capacitor, one end of the second feedback capacitor is connected with the input balun, and the other end thereof is connected with the second differential amplifying circuit.

5. The radio-frequency differential amplifying circuit according to claim 1, wherein the first linear feedback circuit comprises a first feedback resistor and a first feedback capacitor connected in series, and the first feedback resistor is connected with the input balun, and the first feedback capacitor is connected with the first differential amplifying circuit;

the second linear feedback circuit comprises a second feedback resistor and a second feedback capacitor connected in series, the second feedback resistor is connected to the input balun, and the second feedback capacitor is connected with the second differential amplifying circuit.

6. The radio-frequency differential amplifying circuit according to claim 1, wherein the first bias circuit comprises a first power supply and a first bias transistor; the first power supply is connected to the ground end; a first send of the first bias transistor is connected with a connection node between the first power supply and the ground end, a second end of the first bias transistor is connected with a power supply end of the first power supply, and a third end of the first bias transistor is connected with the first coupling resistor; the second bias circuit comprises a second power supply and a second bias transistor, the second power supply is connected to the ground end; a first end of the second bias transistor is connected with a connection node between the second power supply and the ground end, a second end of the second bias transistor is connected with a power supply end of the second power supply, and a third end of the second bias transistor is connected with the second coupling resistor.

7. The radio-frequency differential amplifying circuit according to claim 6, wherein the first bias circuit further comprises a first voltage dividing unit arranged between the first power supply and the ground end, a connection node between the first power supply and the first voltage dividing unit is connected with the first end of the first bias transistor; the second bias circuit further comprises a second voltage dividing unit arranged between the second power supply and the ground end, and a connection node between the second power supply and the second voltage dividing unit is connected with the first end of the second bias transistor.

8. The radio-frequency differential amplifying circuit according to claim 7, wherein the first voltage dividing unit comprises a first voltage dividing diode and a second voltage dividing diode connected in series, and an anode of the first voltage dividing diode is connected with the first power supply, and a cathode of the second voltage divider diode is connected to the ground end; the second voltage dividing unit comprises a third voltage dividing diode and a fourth voltage dividing diode connected in series, an anode of the third voltage dividing diode is connected with the second power supply, and a cathode of the fourth voltage dividing diode is connected to the ground end.

9. A radio-frequency module, wherein the radio-frequency module comprises a radio-frequency differential amplifying circuit, and the radio-frequency differential amplifying circuit comprises an input balun, an output balun, a first differential amplifying circuit, a second differential amplifying circuit, a first linear feedback circuit and a second linear feedback circuit; the first differential amplifying circuit is arranged between a first output end of the input balun and a first input end of the output balun; the second differential amplifying circuit is arranged between a second output end of the input balun and a second input end of the output balun; a first end of the first linear feedback circuit is connected with the input balun, a the second end of the first linear feedback circuit is connected with the first differential amplifying circuit; a first end of the second linear feedback circuit is connected with the input balun, and a second end of the second linear feedback circuit is connected with the second differential amplifying circuit;

the first differential amplifying circuit comprises a first amplifying transistor, a first DC blocking capacitor, a first coupling resistor and a first bias circuit; a first end of the first amplifying transistor is connected with the first DC blocking capacitor, a second end of the first amplifying transistor is connected with the first input end of the output balun, and a third end of the first amplifying transistor is connected to a ground end; the first DC blocking capacitor is arranged between the first output end of the input balun and the first end of the first amplifying transistor; one end of the first coupling resistor is connected with the first bias circuit, the other end thereof is connected with a connection node between the first DC blocking capacitor and the first end of the first amplifying transistor; the second end of the first linear feedback circuit is connected with a connection node between the first coupling resistor and the first bias circuits; and the second differential amplifying circuit comprises a second amplifying transistor, a second DC blocking capacitor, a second coupling resistor and a second bias circuit; a first end of the second amplifying transistor is connected with the second DC blocking capacitor, a second end of the second amplifying transistor is connected with the second input end of the output balun, and a third end of the second amplifying transistor is connected to the ground end; the second DC blocking capacitor is arranged between the second output end of the input balun and the first end of the second amplifying transistor; one end of the second coupling resistor is connected with the second bias circuit, and the other end thereof is connected with a connection node between the second DC blocking capacitor and the first end of the second amplifying transistor; the second end of the second linear feedback circuit is connected with a connection node between the second coupling resistor and the second bias circuit.

10. The radio-frequency module according to claim 9, wherein when the input balun is a single-ended radio-frequency signal input balun, the first end of the first linear feedback circuit is configured to be connected with the first output end of the input balun, and the first end of the second linear feedback circuit is configured to be connected with the second output end of the input balun; or, when the input balun is a single-ended radio-frequency signal input balun, the first end of the first linear feedback circuit is configured to be connected with the second output end of the input balun, and the first end of the second linear feedback circuit is configured to be connected with the first output end of the input balun.

11. The radio-frequency module according to claim 9, wherein when the input balun is a double-ended radio-frequency signal input balun, the first end of the first linear feedback circuit is configured to be connected with the first output end of the input balun, and the first end of the second linear feedback circuit is configured to be connected with the second output end of the input balun; or, when the input balun is a double-ended radio-frequency signal input balun, the first end of the first linear feedback circuit is configured to be connected with the second output end of the input balun, and the first end of the second linear feedback circuit is configured to be connected with the first output end of the input balun; or, when the input balun is a double-ended radio-frequency signal input balun, the first end of the first linear feedback circuit is configured to be connected with the first input end of the input balun, and the first end of the second linear feedback circuit is configured to be connected with the second input end of the input balun; or, when the input balun is a double-ended radio-frequency signal input balun, the first end of the first linear feedback circuit is configured to be connected with the second input end of the input balun, and the first end of the second linear feedback circuit is configured to be connected with the first input end of the input balun.

12. The radio-frequency module according to claim 9, wherein the first linear feedback circuit comprises a first feedback capacitor, one end of the first feedback capacitor is connected with the input balun, and the other end thereof is connected with the first differential amplifying circuit;

the second linear feedback circuit comprises a second feedback capacitor, one end of the second feedback capacitor is connected with the input balun, and the other end thereof is connected with the second differential amplifying circuit.

13. The radio-frequency module according to claim 9, wherein the first linear feedback circuit comprises a first feedback resistor and a first feedback capacitor connected in series, and the first feedback resistor is connected with the input balun, and the first feedback capacitor is connected with the first differential amplifying circuit;

the second linear feedback circuit comprises a second feedback resistor and a second feedback capacitor connected in series, the second feedback resistor is connected to the input balun, and the second feedback capacitor is connected with the second differential amplifying circuit.

14. The radio-frequency module according to claim 9, wherein the first bias circuit comprises a first power supply and a first bias transistor; the first power supply is connected to the ground end; a first send of the first bias transistor is connected with a connection node between the first power supply and the ground end, a second end of the first bias transistor is connected with a power supply end of the first power supply, and a third end of the first bias transistor is connected with the first coupling resistor; the second bias circuit comprises a second power supply and a second bias transistor, the second power supply is connected to the ground end; a first end of the second bias transistor is connected with a connection node between the second power supply and the ground end, a second end of the second bias transistor is connected with a second power supply end of the second power supply, and a third end of the second bias transistor is connected with the second coupling resistor.

15. The radio-frequency module according to claim 14, wherein the first bias circuit further comprises a first voltage dividing unit arranged between the first power supply and the ground end, a connection node between the first power supply and the first voltage dividing unit is connected with the first end of the first bias transistor; the second bias circuit further comprises a second voltage dividing unit arranged between the second power supply and the ground end, and a connection node between the second power supply and the second voltage dividing unit is connected with the first end of the second bias transistor.

16. The radio-frequency module according to claim 15, wherein the first voltage dividing unit comprises a first voltage dividing diode and a second voltage dividing diode connected in series, and an anode of the first voltage dividing diode is connected with the first power supply, and a cathode of the second voltage divider diode is connected to the ground end; the second voltage dividing unit comprises a third voltage dividing diode and a fourth voltage dividing diode connected in series, an anode of the third voltage dividing diode is connected with the second power supply, and a cathode of the fourth voltage dividing diode is connected to the ground end.

* * * * *